United States Patent [19]

Spence

[11] Patent Number: 5,058,988

[45] Date of Patent: Oct. 22, 1991

[54] APPARATUS AND METHOD FOR PROFILING A BEAM

[75] Inventor: Stuart T. Spence, South Pasadena, Calif.

[73] Assignee: 3D Systems, Inc., Sylmar, Calif.

[21] Appl. No.: 268,816

[22] Filed: Nov. 8, 1988

Related U.S. Application Data

[63] Continuation-in-part of Ser. No. 182,830, Apr. 18, 1988.

[51] Int. Cl.$^5$ .............................................. G01J 1/00
[52] U.S. Cl. ................................. 356/121; 425/174.4; 264/22
[58] Field of Search ............................... 356/121–123, 356/237, 356, 355, 153; 250/347, 239; 425/174, 174.1; 164/35; 204/22, 40.1, 25, 308, 250

[56] References Cited

U.S. PATENT DOCUMENTS

| | | | |
|---|---|---|---|
| 4,575,330 | 3/1986 | Hull | 425/174 |
| 4,585,342 | 4/1986 | Lin et al. | 356/124 |
| 4,660,981 | 4/1987 | Stridsberg | 356/398 |
| 4,695,722 | 9/1987 | Motooka | 250/347 |
| 4,745,280 | 5/1988 | Gi et al. | 250/347 |
| 4,752,498 | 6/1988 | Fudim | 425/174.4 |
| 4,799,791 | 1/1989 | Echizen et al. | 356/121 |
| 4,929,402 | 5/1990 | Hull | 264/308 |
| 4,945,032 | 7/1990 | Murphy | 425/174 |

OTHER PUBLICATIONS

"Automatic Method for Fabricating a Three-Dimensional Plastic Model with Photo-Hardening Polymer," by Hideo Kodama, vol. 52, No. 11, Nov. 1981, pp. 1770–1773.

"A new Method of Three-Deminsional Michomachining," by Efrem Fudim, *Mechanical Engineering*, Sep. 1985, pp. 54–59.

"Photopolymerization of Photopolymers by Scanning Laser Beam," by Takashi Nakai and Yaji Maratami, *Reiza Kenkyu*, vol. 16, No. 1, pp. 14–22, Jan. 1988.

*Primary Examiner*—Richard A. Rosenberger
*Assistant Examiner*—Hoa Pham
*Attorney, Agent, or Firm*—Lyon & Lyon

[57] ABSTRACT

An apparatus and a method for profiling the intensity of a beam and thus measuring the overall intensity and power of a beam are disclosed that have particular use in stereolithography. A beam sensor comprising a pinhole in a plate and a photodetector behind the pinhole measures the intensity of portions of a beam as the beam is moved over the beam sensor. Software associated with the sensors in a computer controls the scanning mechanism for the beam so that the beam is shifted to find the pinhole and move across it in order to develope the intensity profile. The invention can be used to detect drift in the scanning mechanism, determine the focus of the beam, and predict the depth and width of photopolymer cured by the beam.

22 Claims, 13 Drawing Sheets

CHAMBER ASSEMBLY (A)

ELECTRONIC CABINET ASSEMBLY (REAR VIEW) (B)

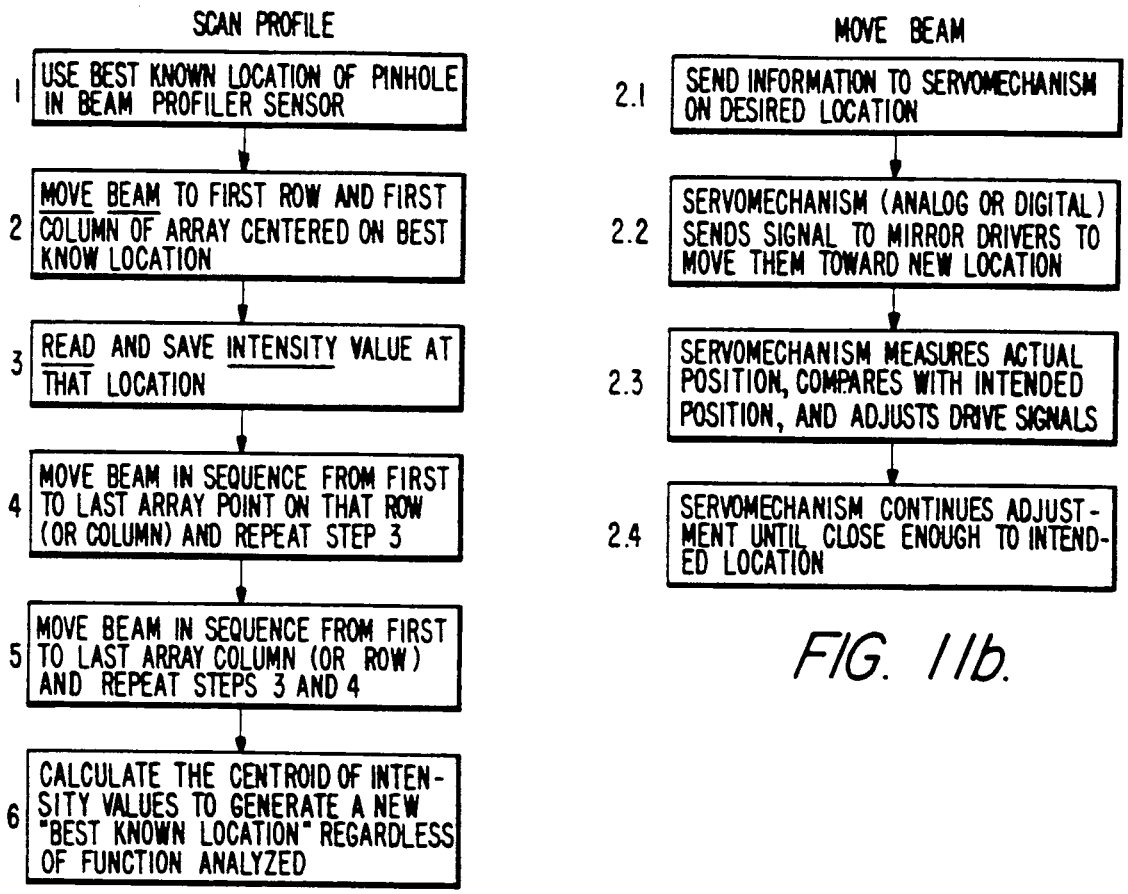
FIG. 11a.
FIG. 11b.
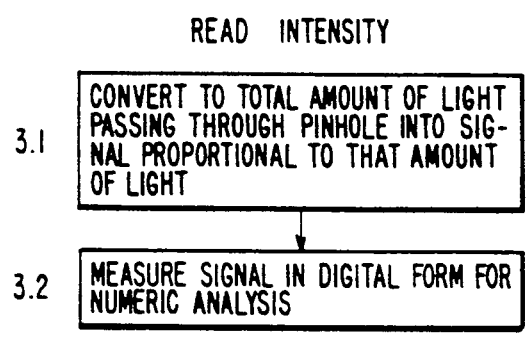
FIG. 11c.

APPARATUS AND METHOD FOR PROFILING A BEAM

RELATED APPLICATIONS

This application is a continuation-in-part of U.S. Pat. application Ser. No. 182,830, filed Apr. 18, 1988. Related applications filed concurrently on that date are U.S. Pat. application Ser. Nos. 182,823; 183,016; 183,015; 182,801; 183,014; and 183,012, all of which are hereby fully incorporated herein by reference. Continuations-in-part of U.S. Pat. application Ser. Nos. 182,830, 183,016; 183,014; and 183,012, are being concurrently filed herewith, all of which are hereby fully incorporated herein by reference. These concurrently filed applications are U.S. Pat. application Ser. Nos. 269,801; 268,907; 268,837; 268,408; 268,428; and 268,429.

BACKGROUND OF THE INVENTION

This invention relates generally to apparatus and methods for measuring beams of electromagnetic radiation or particles and, more particularly, to a new apparatus and method for measuring the intensity profile of beams in connection with the production of three-dimensional objects by stereolithography.

In recent years, "stereolithography" systems, such as those described in U.S. Pat. No. 4,575,330 entitled "Apparatus For Production Of Three-dimensional Objects By Stereolithography," have come into use. The disclosure of U.S. Pat. No. 4,575,330 is hereby incorporated by reference, as if fully set forth herein. Basically, stereolithography is a method for automatically building complex plastic parts by successively printing cross-sections of photocurable polymer or the like on top of each other until all of the thin layers are joined together to form a whole part. With this technology, the parts are literally grown in a vat of liquid plastic. This method of fabrication is extremely powerful for quickly reducing design ideas to physical form and for making prototypes.

Photocurable polymers ("photopolymers") change from liquid to solid in the presence of light and their photospeed with ultraviolet light (UV) is fast enough to make them practical model building materials. The material that is not polymerized when a part is made is still usable and remains in the vat as successive parts are made. An ultraviolet laser may be used which generates a small intense spot of UV light. This spot is moved across the liquid surface with a galvanometer X-Y mirror scanner. The scanner is driven by computer generated vectors or the like. Precise and complex patterns can be rapidly produced with this technique.

The laser scanner, the photopolymer vat, and an elevator, along with a controlling computer, combine together to form a stereolithography apparatus, referred to as an "SLA." An SLA is programmed to automatically make a plastic part by "drawing" one cross-section at a time, and building it up layer by layer.

Stereolithography represents an unprecedented way to quickly make complex or simple parts without tooling. Since this technology depends on using a computer to generate its cross-sectional patterns, a natural data link to CAD/CAM exists.

To be effective, a stereolithography system must have information about the focus, laser beam oscillation mode, beam power, intensity distribution or profile, and scanning system drift of the drawing laser in order to carry out the accurate and efficient production of parts (objects made by stereolithography are known as "parts"). The beam must be in relative focus at the surface of the working photopolymer fluid. The laser mode, intensity distribution, and beam power are important to the depth and width of cure of the working fluid, as well as the scan speed. The "drift" of the scanning system must be measured and corrected periodically.

Beam profile (a profile of the intensity of the beam) measurements provide useful information about the beam because they can help accomplish the following purposes: 1. Focus optics and correct astigmatism and other aberrations; 2. Measure the power of the beam (needed on a day to day basis); 3. Study the laser mode and changes of the mode; 4. Compensate for drift of the laser scanning system; 5. Allow recording of the drift for later analysis of changes; 6. Automatically calibrate the scanners; 7. Allow easy control of beam position for making other measurements (e.g. to independently measure the beam power in order to find the system's power calibration factor); and 8. Permit the prediction of the size and shape of the cured plastic trace.

Accordingly, a need exists for an apparatus and method to rapidly determine the profile of the beam, particularly in connection with a stereolithographic apparatus.

SUMMARY OF THE INVENTION

Briefly, and in general terms, the present invention provides a new and improved apparatus and method for profiling a beam. The apparatus comprises means for measuring the intensity of a portion of the beam when the beam is incident on the measuring means and means for changing the relative perpendicular displacement of the measuring means from an optical path followed by the beam in order to measure the intensity of some or all portions of the beam along a surface substantially perpendicular to the optical path followed by the beam. The method for profiling a beam comprises the step of measuring the intensity of a cross-sectional portion of preselected size of the beam along a surface substantially perpendicular to the optical path followed by the beam and repeating the measuring step for other portions of the beam along the surface.

The apparatus and the method develops an intensity map of the beam along a surface substantially perpendicular to the optical path followed by the beam. The intensity map gives the intensities for each of the portions of preselected size of the cross-section of the beam. The intensity profile so gained can be used to determine and adjust the focus of the beam as well as to calculate the power of the beam (given a known power conversion factor). The profile of the beam may be used to predict the cure depth and width of plastic created on the working fluid. The beam profiling apparatus may be used to detect drift of the apparatus that scans the beam, by serving as a fixed reference point and determining the scanning apparatus coordinates of the center of the beam, which can be used to recalibrate the positioning "map" or table that directs the scanning apparatus in translating computer generated designs to actual dimensions on the surface of the fluid that solidifies to form the object.

The presently preferred version of the beam profiling system has a significant advantage of economy because it uses the computing system and light-beam positioning system which are already present in the stereolithographic apparatus. Although the present system refers to "laser beam" and "X-Y galvanometer scanning system" it is apparent that these advantages also apply to other possible systems with different energy sources or positioning means or combinations of these.

The above and other objects and advantages of this invention will be apparent from the following more detailed description when taken in conjunction with the accompanying drawings of illustrative embodiments.

BRIEF DESCRIPTION OF THE DRAWINGS

FIG. 11A is a functional block diagram of the preferred embodiment of the method of generating an intensity profile of a beam according to the present invention;

FIG. 11B is a functional block diagram of a method of moving a beam in carrying out the method described in FIG. 11A;

FIG. 11C is a functional block diagram of a method of reading the intensity of a portion of a beam in carrying out the method described in FIG. 11A;

DESCRIPTION OF THE PREFERRED EMBODIMENT

The stereolithographic system with which the apparatus and method of the preferred embodiment of the present invention is used generates three-dimensional objects by creating a cross-sectional pattern of the object to be formed at a selected surface of a fluid medium, e.g., a UV curable liquid or the like, capable of altering its physical state in response to appropriate synergistic stimulation such as impinging radiation beams, or electron or other particle beam bombardment. Successive adjacent laminae, representing corresponding successive adjacent cross-sections of the object, are automatically formed and integrated together to provide a stepwise laminar or thin layer buildup of the object, whereby a three-dimensional object is formed and drawn from a substantially planar or sheet-like surface of the fluid medium during the forming process. The technique is generally described in the flow charts and diagrams of FIGS. 1-5.

Figure 1:
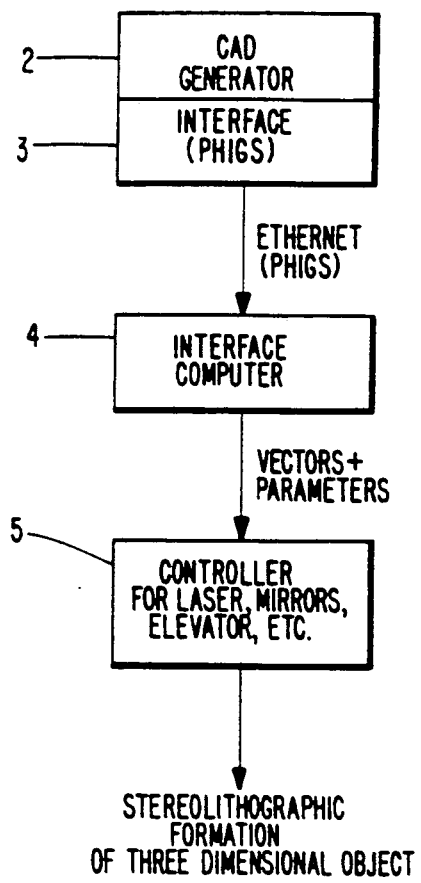
FIGS. 1, 2 and 3 are flow charts illustrating the basic concepts employed in practicing the method of stereolithography.
Figures 2, 3:
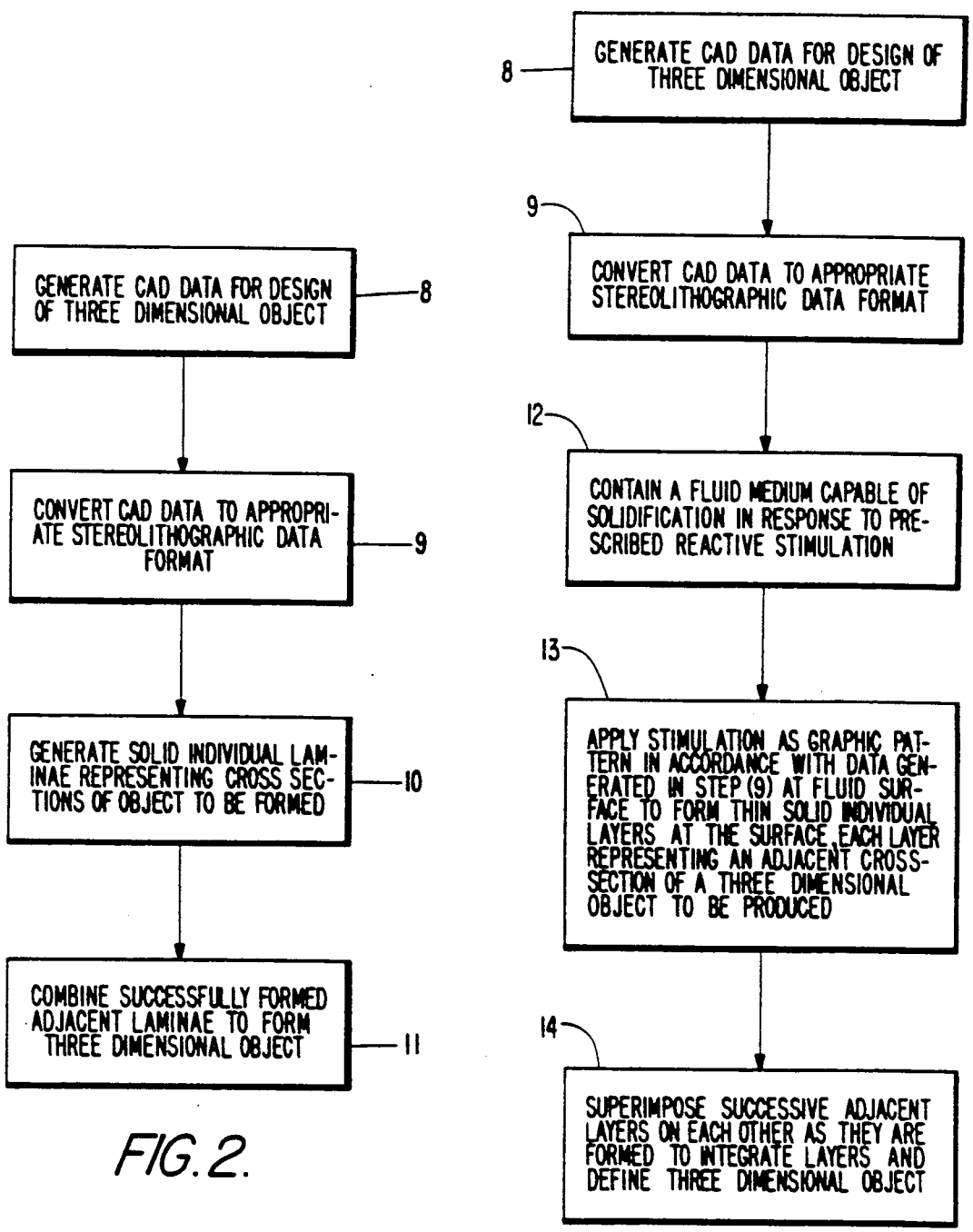
Figure 4:
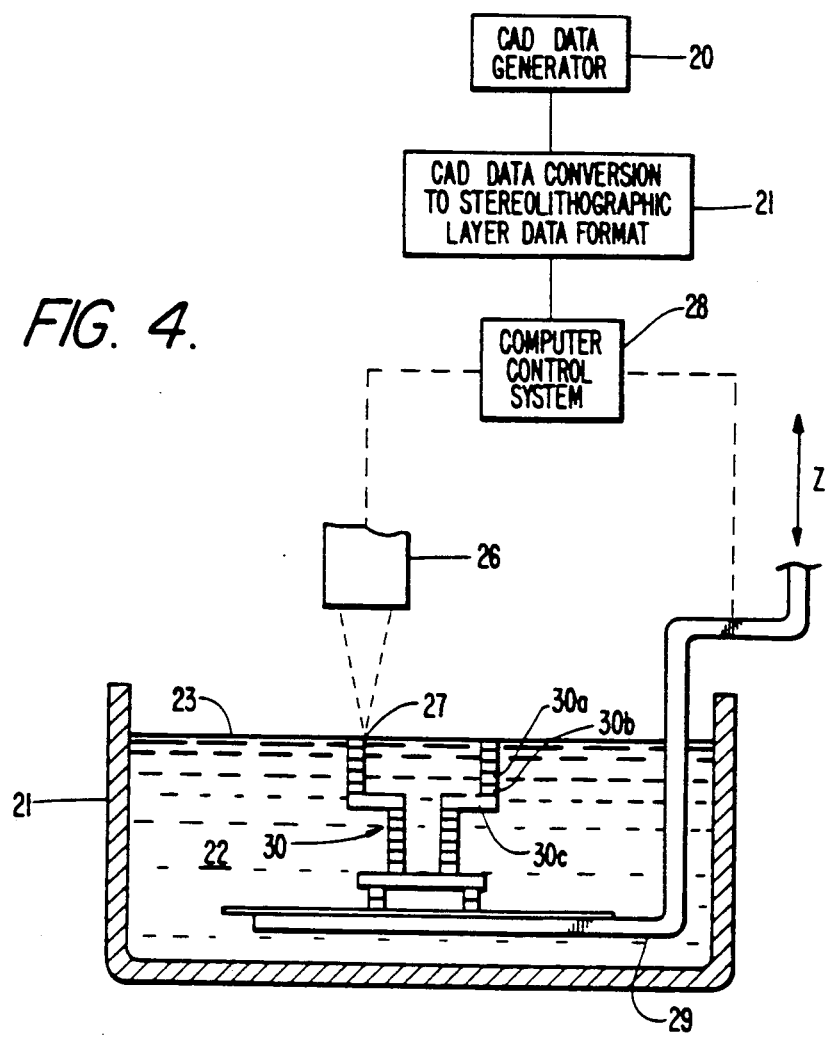
FIG. 4 is a combined block diagram, schematic and elevational sectional view of a stereolithography system.

A stereolithographic system is shown in elevational cross-section in FIG. 4. A container 21 is filled with a UV curable liquid 22 or the like, to provide a designated working surface 23. A programmable source of ultraviolet light 26 or the like produces a spot of ultraviolet light 27 in the plane of surface 23. The spot 27 is movable across the surface 23 by the motion of mirrors or other optical or mechanical elements (not shown in FIG. 4) used with the light source 26. The position of the spot 27 on surface 23 is controlled by a computer control system 28. The system 28 may be under control of CAD data produced by a generator 20 in a CAD design system or the like and directed in PHIGS format or its equivalent to a computerized conversion system 21 where information defining the object is specially processed to reduce stress, curl and distortion, and increase resolution, strength and accuracy of reproduction.

A movable elevator platform 29 inside container 21 can be moved up and down selectively, the position of the platform being controlled by the system 28. As the device operates, it produces a three-dimensional object 30 by step-wise buildup of integrated laminae such as 30a, 30b, 30c.

The surface of the UV curable liquid 22 is maintained at a constant level in the container 21, and the spot of UV light 27, or other suitable form of reactive stimulation, of sufficient intensity to cure the liquid and convert it to a solid material is moved across the working surface 23 in a programmed manner. As the liquid 22 cures and solid material forms, the elevator platform 29 that was initially just below surface 23 is moved down from the surface in a programmed manner by any suitable actuator. In this way, the solid material that was initially formed is taken below surface 23 and new liquid 22 flows across the surface 23. A portion of this new liquid is, in turn, converted to solid material by the programmed UV light spot 27, and the new material adhesively connects to the material below it. This process is continued until the entire three-dimensional object 30 is formed. The object 30 is then removed from the container 21, and the apparatus is ready to produce another object. Another object can then be produced, or some new object can be made by changing the program in the computer 28.

The light source 26 of a stereolithography system according to a preferred embodiment of the invention is typically a helium-cadmium ultraviolet laser such as the Model 4240-N HeCd Multimode Laser, made by Liconix of Sunnyvale, CA.

A commercial stereolithography system will have additional components and subsystems besides those previously shown in connection with the schematically depicted systems of FIGS. 1-5. For example, the commercial system would also have a frame and housing, and a control panel. It should have means to shield the operator from excess UV and visible light, and it may also have means to allow viewing of the object 30 while it is being formed. Commercial units will provide safety means for controlling ozone and noxious fumes, as well as conventional high voltage safety protection and interlocks. Some commercial units will also have means to effectively shield the sensitive electronics from electronic noise sources.

Figure 5:
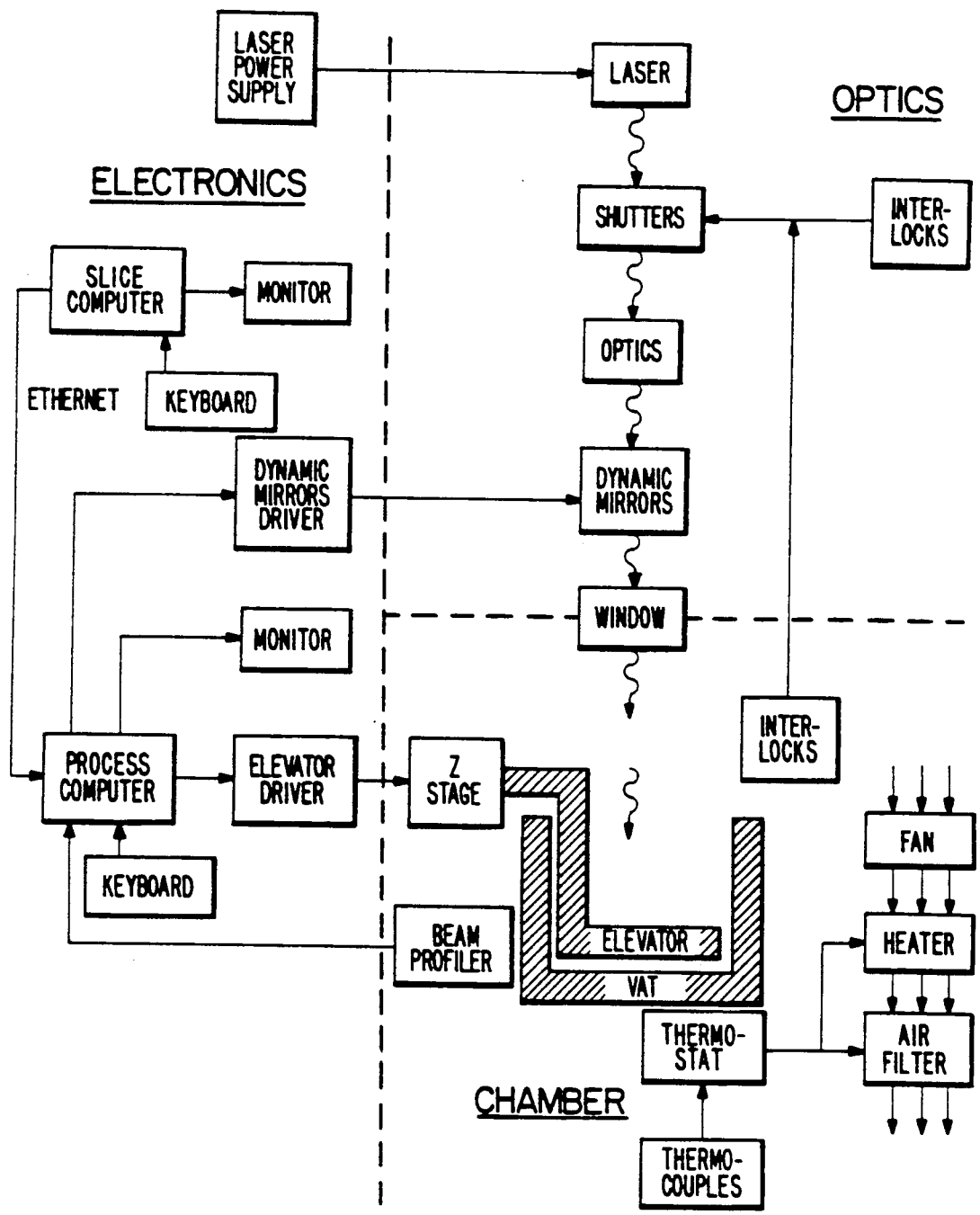
FIG. 5 is a block diagram of a stereolithography system.
Figure 6:
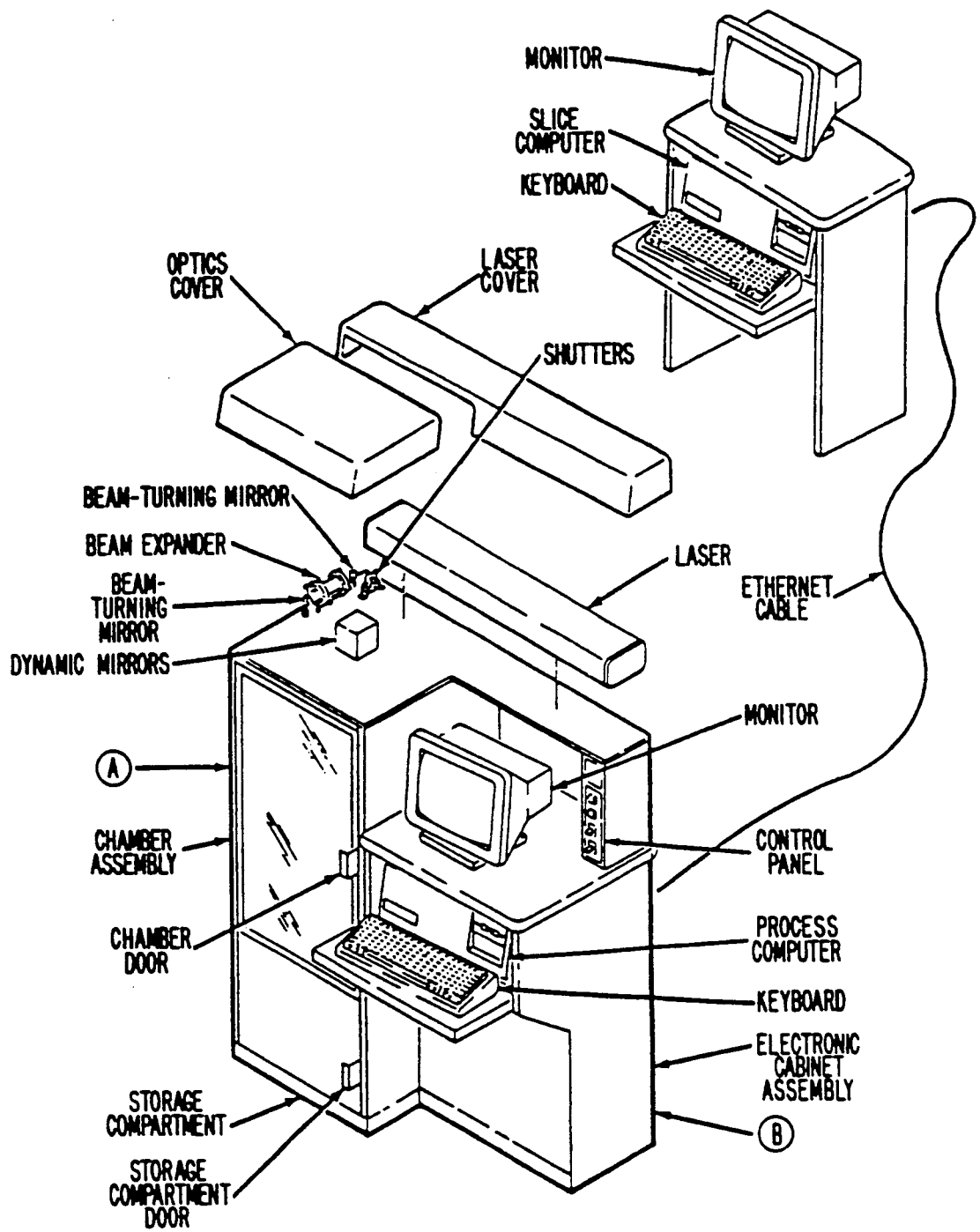
FIGS. 6 and 7A and 7B are exploded perspective views of the major component groups in a stereolithography system.
Figure 7A:
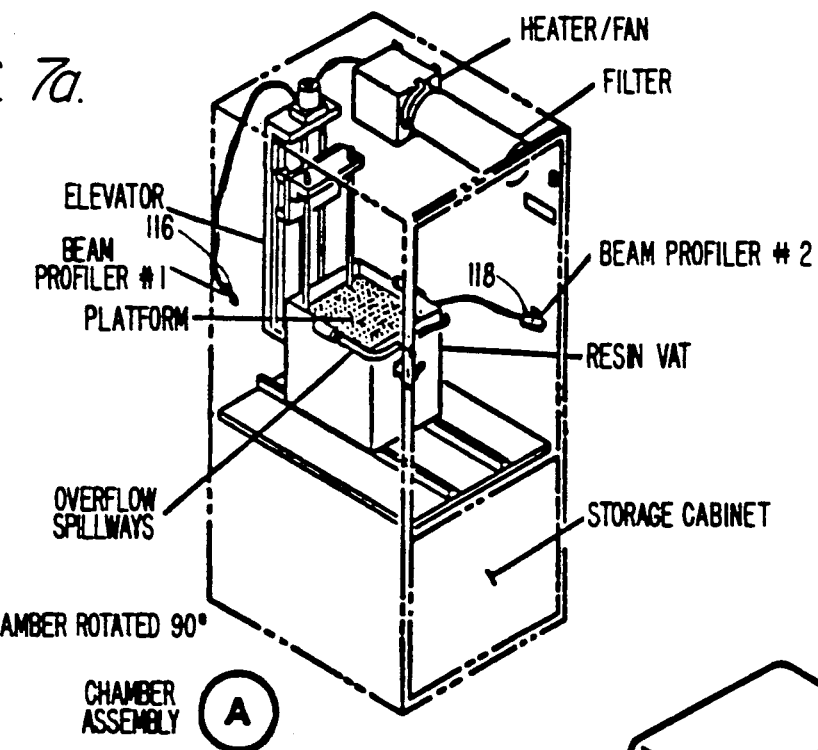
Figure 7B:
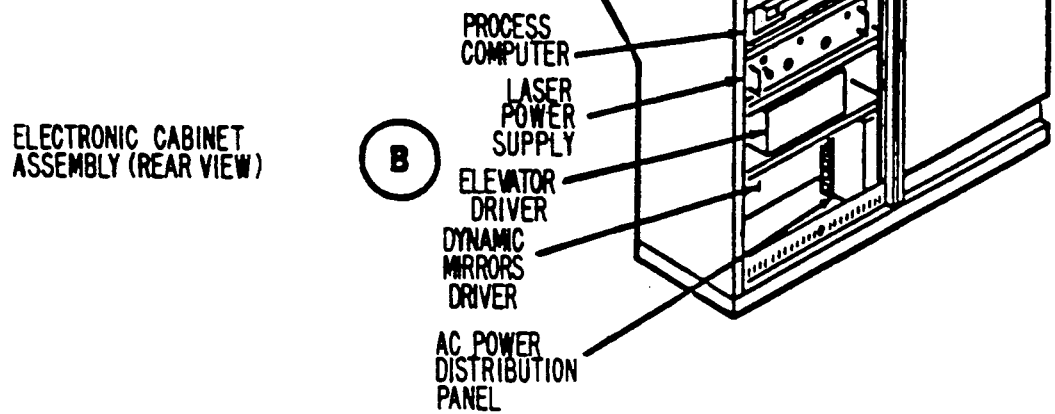

The commercialized SLA is a self-contained system that interfaces directly with the user's CAD system. A commercialized SLA containing the preferred embodiment of the apparatus of the present invention, as shown in FIGS. 6 and 7, consists of four major component groups: the SLICE computer terminal, the electronic cabinet assembly, the optics assembly, and the chamber assembly. A block diagram of the commercialized SLA is shown in FIG. 5.

The electronic cabinet assembly includes the process computer, keyboard, monitor, power supplies, ac power distribution panel, and control panel. The computer assembly includes plug-in circuit boards for control of the terminal, high-speed scanner mirrors, and vertical (Z-stage) elevator. Power supplies for the laser, dynamic mirrors, and elevator motor are mounted in the lower portion of the cabinet.

The control panel includes a power on switch/indicator, a chamber light switch/indicator, a laser on indicator, and a shutter open indicator.

Operation and maintenance parameters, including fault diagnostics and laser performance information, are also typically displayed on the monitor. Operation is controlled by keyboard entries. Work surfaces around the keyboard and computer are covered with formica or the like for easy cleaning and long wear.

Figure 8:
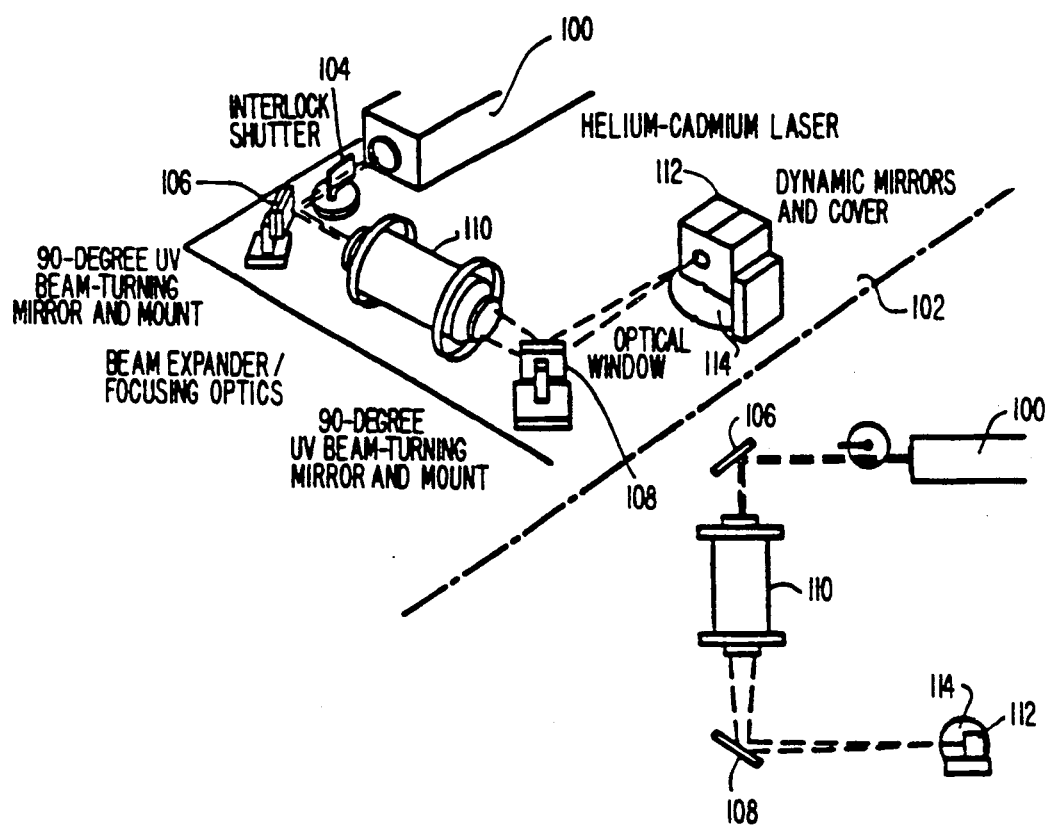
FIG. 8 is a perspective view of the laser and optical system in a stereolithography system which utilizes the preferred embodiment of the present invention.

Turning to FIG. 8, the helium cadmium (HeCd) laser 100 and optical components are mounted on top of the electronic cabinet and chamber assembly 102. The laser and optics plate may be accessed for service by removing separate covers. For safety reasons, a special tool is required to unlock the cover fasteners and interlock switches are activated when the covers are removed. The interlocks activate a solenoid-controlled shutter to block the laser beam when either cover is removed.

As shown in FIG. 8, the shutter assembly 104, two ninety degree beam-turning mirrors 106, 108, a beam expander 110, an X-Y scanning mirror assembly 112, and precision optical window 114 are mounted on the optics plate. The rotary solenoid-actuated shutters are installed at the laser output and rotate to block the beam when a safety interlock is opened. The ninety degree beam-turning mirrors 106, 108 reflect the laser beam to the next optical component. The beam expander 110 enlarges and focuses the laser beam on the liquid surface. The high speed scanning mirrors direct the laser beam to trace vectors on the resin surface. The 2-mirror, 2-axis galvanometer scan heads sold by General Scanning Inc. of Watertown, MA have been found to be satisfactory for this purpose and in a preferred embodiment their Model DX-2005 servo and Model XY-0507 galvanometer X-Y scanning heads are used. A quartz window 114 between the optics enclosure and reaction chamber allows the laser beam to pass into the reaction chamber, but otherwise isolates the two regions.

The chamber assembly contains an environmentally-controlled chamber, which houses a platform, resin vat, elevator, and beam profilers.

The chamber in which the object is formed is designed for operator safety and to ensure uniform operating conditions. The chamber may be heated to approximately 40° C. (104° F.) and the air is circulated and filtered. An overhead light illuminates the reaction vat and work surfaces. An interlock on the access door activates a shutter to block the laser beam when opened.

The resin vat is designed to minimize handling of the resin. It is typically installed in the chamber on guides which align it with the elevator and platform.

The object is formed on a platform attached to the vertical axis elevator, or Z-stage. The platform is immersed in the resin vat and it is adjusted incrementally downward while the object is being formed. To remove the formed part, it is raised to a position above the vat. The platform is then disconnected from the elevator and removed from the chamber for post processing. Handling trays are usually provided to catch dripping resin.

Two beam profiler sensors 116, 118 according to the preferred embodiment of the present invention are mounted at the sides of the resin vat and the focal point of the laser optical system is adjusted to match radial sensor positions (i.e., they are mounted at a radial distance from the galvanometer scanners equal to the distance from the galvanometers to a point 0.3 inches below the surface of the liquid). (See FIG. 7). The scanning mirror is periodically commanded to direct the laser beam onto the beam profiler sensors, which measure the beam intensity profile. The data may be displayed on the terminal, either as a profile with representation of intensity values or as a single number representing the overall (integrated) beam intensity. This information is used to determine whether the mirrors should be cleaned and aligned, whether the laser should be serviced, whether the scanner mirrors have drifted, and what parameter values will yield cured vectors of the desired thickness and width.

The beam profiler sensors 116, 118 are symmetrically placed relative to the center of the resin vat. (See FIG. 7). They should preferably have similar X and Y offsets as measured from the vat center (of opposite values) although this is not required; that is to say, they are on a diagonal of the stereolithographic apparatus. In FIG. 7, the beam profiler sensors 116, 118 are seen in the corners of the chamber assembly. The distance from the second scanning mirror on the optical plate above the chamber assembly to each beam profiler sensor aperture is the focal length which equals the desired liquid to scanning mirror length plus a small increment. In the SLA-1 sold by 3D Systems, Inc. (which is shown in FIGS. 6 and 7), this liquid to scanning mirror length is approximately 27 inches and the small increment is an additional 0.3 inches, therefore the focal length is approximately 27.3". The distancing of the beam profiler sensors 116, 118 from the second mirror by the desired focal length has the effect of detecting the best average focus for the designated surface of the photopolymer in the SLA-1 resin vat. At the center of the resin vat, when the photopolymer is at the desired level, the focal length of the laser beam will be 0.3 inches below the surface of the photopolymer. The focus of the beam at the surface of the photopolymer in the center of the resin vat will not vary much. At the corner of the 12 inch resin vat of the SLA-1, the focal length will be approximately 1 inch above the surface of the photopolymer. The focal length will be at the surface of the photopolymer at a circle with a 4.2 inch radius about the center of the surface of the photopolymer. The placement of the beam profiler sensor at the focal length is intended to obtain an optimal beam profile considering that the surface of the photopolymer will mostly not be at the focal length of the laser.

Figure 9A:
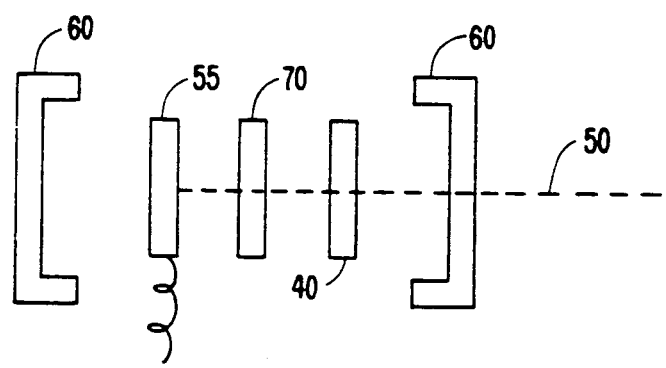
FIG. 9A is a cross-sectional schematic view of a beam profiler sensor of the preferred embodiment of the present invention.
Figure 9B:
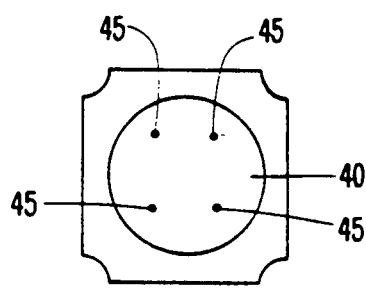
FIG. 9B is a top plan view of a pinhole plate for a beam profiler sensor of the preferred embodiment of the present invention.

FIG. 9A is a cross-sectional view of a beam profiler sensor 35 (the two different sensors are labeled as sensors 116 and 118 in FIG. 7) of a preferred embodiment of the apparatus of the present invention and FIG. 9B is a top plan view of a pinhole plate used in the beam profiler sensor. The beam profiler sensor has a thin stainless steel metal plate 40 having four etched pinholes 45 of varying size. In a preferred embodiment these holes have diameters 0.0005", 0.001", 0.002", and 0.004". The pinholes each permit a small fraction of the laser beam 50 incident upon the pinhole to fall on a photodetector 55 underneath the plate 40. The purpose for providing several pinholes is to permit profiling of beams having a wide range of incident power. One of the pinholes will be best suited for measuring the intensity profile of a beam of a given incident power. For the HeCd lasers used in the SLA-1, a pinhole of 2 mil (0.002 inch) diameter has been found to be satisfactory. The beam is scanned across a selected pinhole in an X Y array to build up a two dimensional profile of the beam intensity.

As may be seen in FIGS. 7 and especially 9A, the beam profiler sensor 35 has a two part housing 60. Light beam 50 enters from the right and moves toward the left in FIG. 9A. The beam profiler sensor is mounted in the corners of the chamber assembly compartment in such a way as to prevent the resin vat from hitting the beam profiler sensor when it is moved into and out of the compartment (see FIG. 7).

Turning to FIG. 9A the beam profiler sensor 35 comprises a split two part housing 60, pinhole plate 40, ultra-violet transmitting filter 70 that absorbs visible light and prevents spurious readings due to visible light. Filter 70 is a two millimeter thickness of Schott UG-11 filter glass which has been found to be acceptable for this purpose in a preferred embodiment. The characteristics of this filter provide reasonable transmission of light in the 300–370 nanometer wavelength region with considerably less transmittance at other wavelengths. A one-millimeter thickness of HOYA U-350 filter material would also be acceptable.

Underneath the filter 70 in the beam profiler housing is a photodiode sensor 55 which detects the ultraviolet light which passes through the filter 70 from the pinhole 45. An EEG Vactec VTS 3072 super blue enhanced photodiode has been found to be acceptable. The output from this photodiode is passed to a current to voltage amplifier (not shown). An OP07 current to voltage amplifier whose implementation is well known to those skilled in the art has been found to be acceptable.

The pinhole plate 40 of the beam profiler sensor 35 is covered with a quartz filter (not shown). The quartz filter is cleanable and protects the beam profiler sensor from dust and photopolymer drips. The quartz filter should be coated to prevent internal reflections when the photosensor is not perpendicular to the beam, in order to prevent false shape measurements. Optionally a diffuser (not shown) can be used between the pinholes to aid the filter to protect the optical components from damage by intense UV beams.

Figure 10:
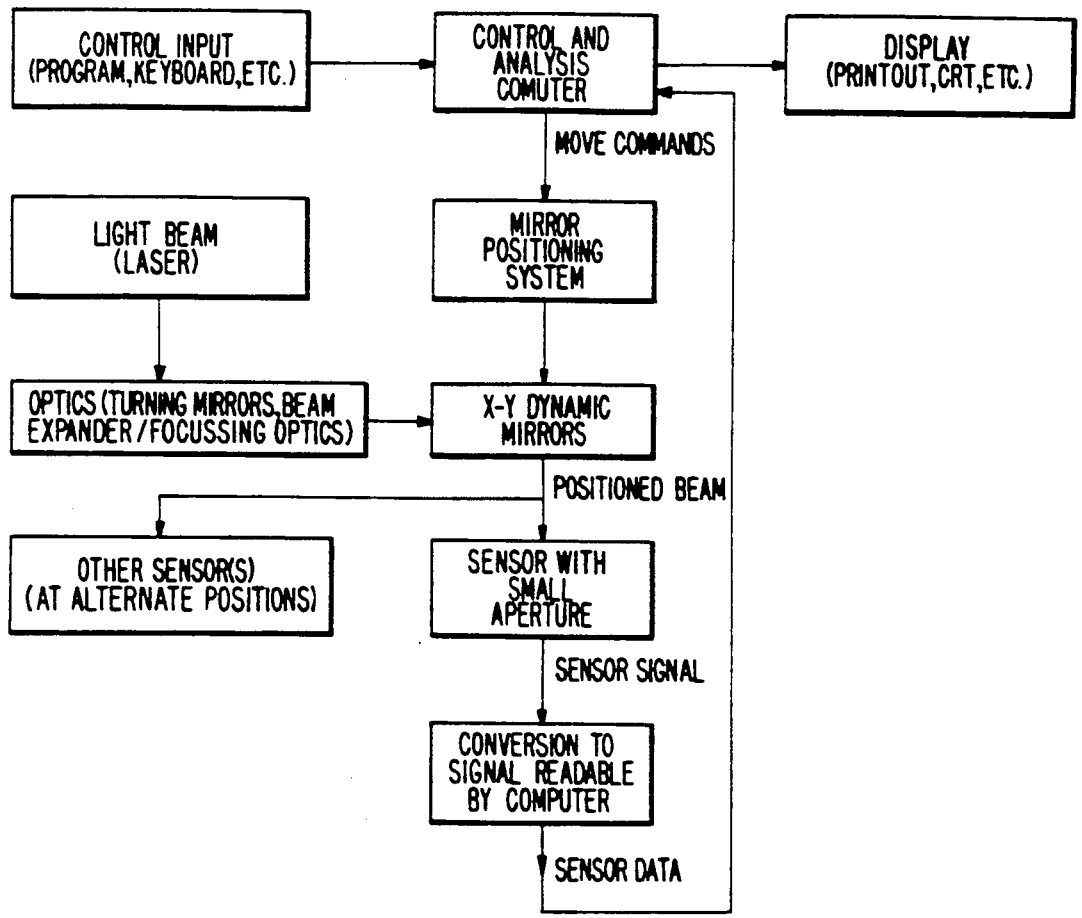
FIG. 10 is a block diagram showing the apparatus of a preferred embodiment of the present invention.

FIG. 10 is a block diagram showing the apparatus of the preferred embodiment of the present invention. Fundamental to the invention is a control and analysis computer. This computer receives inputs from a program, a keyboard or the like and may display results through a printer or terminal or the like. The control and analysis computer sends positioning commands to a mirror positioning system which controls the X Y scanner mirrors. The laser beam is focused by the optics shown in FIG. 8 to reach the X Y scanner mirrors and is directed by those mirrors to one of the beam profiler sensors. The use of two beam profiler sensors is recommended for the purpose of drift correction. The sensor signal from the beam profiler sensors is converted to a signal readable by the computer which is then sent back to the control and analysis computer to be manipulated as described hereafter.

In physical terms, the beam profile method according to the present invention causes the beam to be moved to each of the points of an array on the pinhole plate centered on the best known position of the pinhole. As a result, different sectors of the beam will fall on the pinhole and will be transmitted through the same to be detected by the photodiode and converted into a numerical signal that can be analyzed by the computer. A profile of the intensity of different sectors of the beam will be built up by the computer (see FIG. 13). This is the "intensity profile" of the beam.

FIG. 11A is a functional block diagram showing how a beam profile is developed according to the preferred embodiment of the invention. The best known location of a pinhole on the beam profiler sensor is called up from memory by the control and analysis computer and sent to the mirror positioning system to position the X Y scanner mirrors to direct the beam at this best known location. The control and analysis computer, through the beam positioning system, moves the beam to the first row in the first column of a square array centered on the best known location. The intensity of the portion of the beam entering the pinhole as detected by the beam profiler sensor is then read and is saved as well as the mirror position commands which are associated with that intensity. The beam is then moved in sequence from the first to the last array points on a particular row or column and the reading and saving intensity value steps are repeated. The beam is then moved in sequence from the first to the last array columns or rows and the moving and reading steps are then performed down each column or row. The result is that beam intensity readings are taken for each of the positions on the array (a "position" is known to the computer as a set of mirror positioning commands). A standard analysis, performed by the control and analysis computer of the array of intensity values is usually performed to generate a new best known location of the pinhole (for use in performing the first step of the scan profile the next time) regardless of the detailed function actually being analyzed (see FIG. 12).

FIG. 11B is a functional block diagram of a method of moving a beam and carrying out the method described in connection with FIG. 10A. To move the beam, the first step is to send the beam positioning information to the servomechanism of the X Y scanner mirrors concerning the desired location. The servomechanism (which may be analog or digital) then sends a signal to the mirror drivers to position the X Y scanner mirrors to a new location. The servomechanism of the X Y scanner mirrors measures the actual position of the mirror drivers and compares the actual position with the intended position and adjusts the drive signals accordingly. The adjustments are continued within specification values of the intended location.

FIG. 11C is a functional block diagram of a method of reading the intensity of a portion of a beam and carrying out the method of the preferred embodiment of the present invention. The first step is to convert the total amount of light which passes through the pinhole into a signal which is proportional to that amount of light. In the preferred embodiment, this process is performed by the photodiode which measures the light coming through the pinhole and the filter. The current from the photodiode is sent to a current to voltage amplifier which generates a signal proportional to the amount of light received by the photodiode. The next step is to measure the signal, which is proportional to the amount of light received, after the signal is converted into a digital form for numerical analysis. Amplification of the signal to provide wide dynamic range of the measurement is important to obtain small but significant readings for the edge of the beam which would otherwise be lost.

Figure 12:
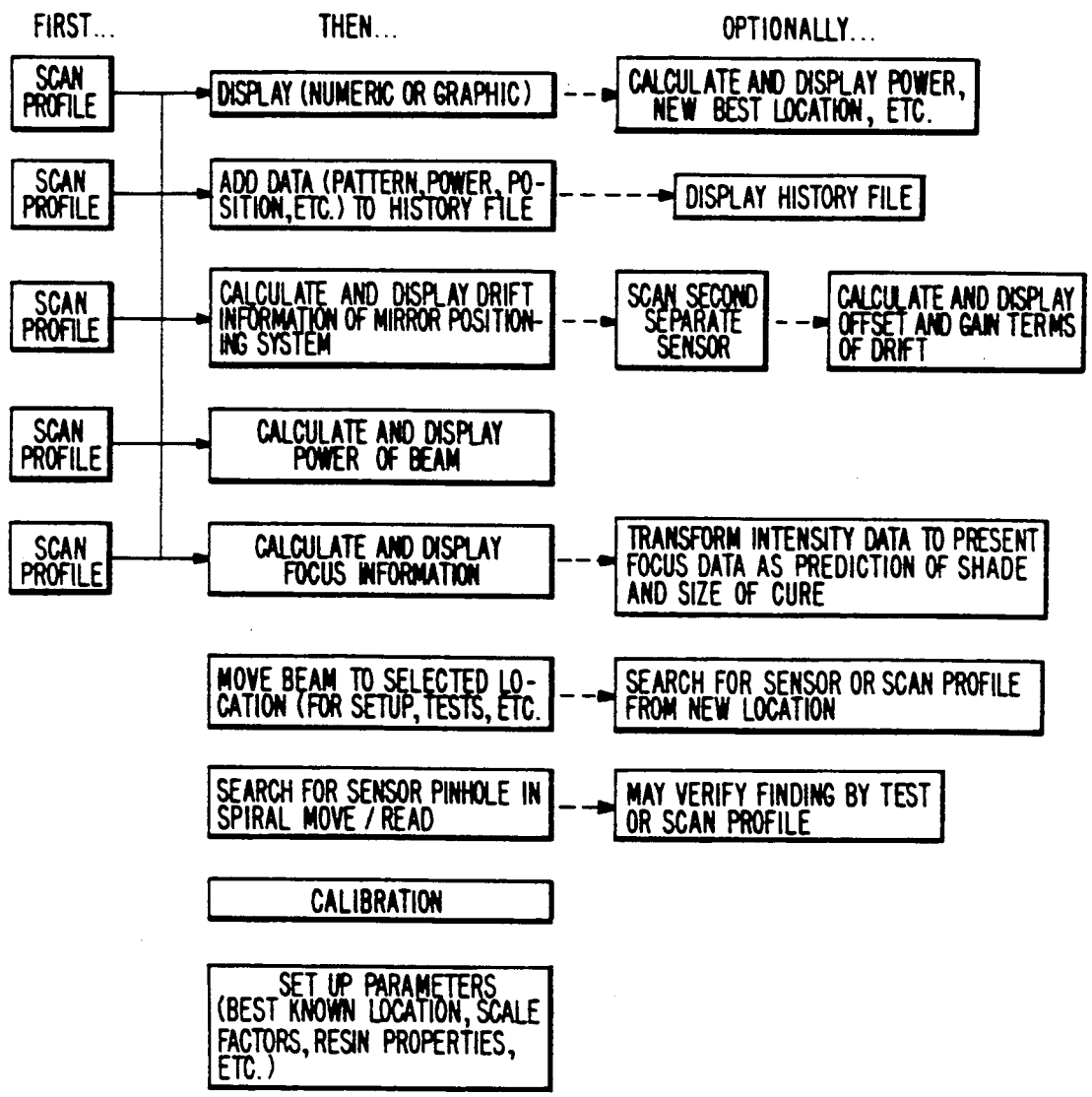
FIG. 12 is a functional block diagram showing process and analyses which may be coupled with the method described in FIG. 11A.

FIG. 12 is a functional block diagram showing the processes and analyses which may be coupled with the method described in FIG. 11A. As may be observed from that figure, a number of different processes and analyses may be selected from a menu, the first five of which are connected to the scan profile routine of FIG. 11A. The first step is to scan the intensity profile of the beam according to the method described in connection with FIG. 11A. The intensity profile may be displayed numerically or in the form of a graph. As an option, the power may be calculated from the intensity profile as well as a new best known location of the pinhole used. Another possible process is to add the data generated in connection with the beam intensity profile to a history file with an option of displaying the history file. A further possible process is to calculate and display drift information for the mirror positioning system which generally involves scanning a second separate sensor (in the case of the preferred embodiment, another beam profiler sensor) and then calculating and displaying the offset and gain terms of the drift. Another process is to calculate and display the power of the beam, which involves summing up the intensities of a profile and multiplying by a power conversion factor. The power conversion factor can be determined, for example, by utilizing the process with a beam of known power or by comparing calculated power to that of a calibrated sensor and determining required the gain factor. A further function is to calculate and display focus information, with a possible option of using a special transformation of the intensity data used to calculate focus information and the use of known resin properties to predict the shape and size of the cured traces of photopolymer. Another possible function is to move the beam to the desired location for set up (to make parts), tests and so forth with an option for searching for the sensor or scan profile from this new location. A useful function is to search for sensor pinholes in a spiral move-read format. This may be necessary if the best known location of the pinhole is not accurate, in case when the array is traced over the best known location the pinhole is not detected. A further step may be to verify findings (of pinhole location) by test or scan profile. A still further function is the use of the beam profilers in calibration, which involves the measurement of the drift while obtaining a calibration map for the surface corresponding to the surface of the photopolymer. A final function is to store in the machine the parameters of best known location, scale factors, resin properties, and so forth.

Figure 13:
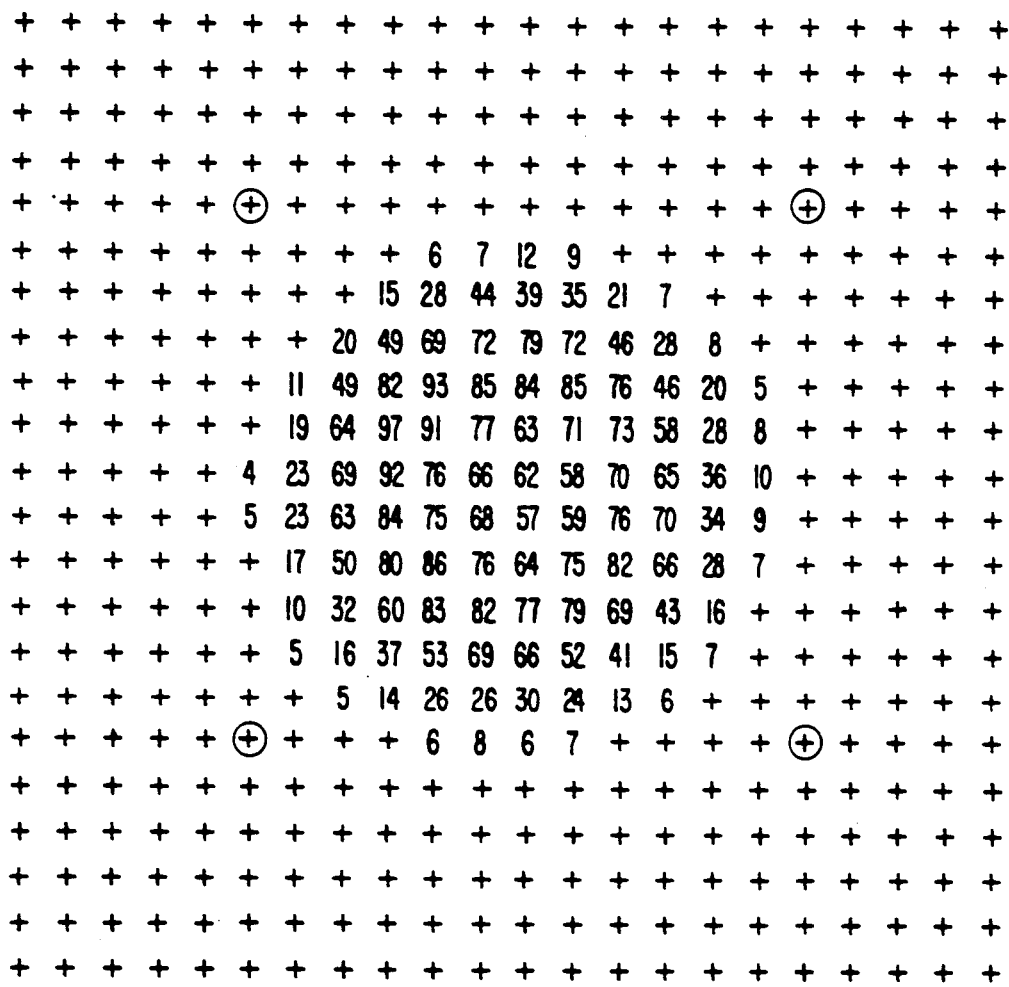
FIG. 13 is a chart showing a sample intensity profile for a beam generated by a preferred embodiment of the invention.

FIG. 13 is a chart showing a sample intensity profile for a laser beam as generated by a preferred embodiment of the present invention. The numerical values correspond to the measured intensity of a beam from a preferred embodiment of the present invention. The numbers have been converted to integers for ease of reading the display.

The intensity profile generated by the present invention may be used to calculate the power of the beam and to predict the shape and dimension of a cured trace of photopolymer (the solidified photopolymer due to exposure to the beam of UV light), as the following discussion will demonstrate.

The intensity of the beam is measured by the beam profiling apparatus when the beam is directed at each point of an array on the pinhole plate, which is a surface generally perpendicular to the optical path taken by the beam. The X and Y directions on this surface correspond to the directions taken by the beam when one or the other of the scanning mirrors rotate.

The X and Y array coordinates are 1 to $i_{max}$ and 1 to $j_{max}$, respectively (typically $i_{max}$ and $j_{max}$ are each equal to 22).

The beam is typically stepped or moved from point to point in the array, the time for the movement being much less than the time the beam remains at a point. The distance between points is:

$$s \text{ (mm)} = \text{scanstep/scalefactor} \quad [\text{Eq. 1}]$$

The scanstep is typically 4 "bits" and the scale factor is normally 140 bits/mm. The scanning mirrors can each take on 65535 (64K) different positions over a 40° optical beam rotation. This in turn means that 1 bit along the X or Y axis corresponds to a rotation of $6.104 \times 10^{-4}$ degrees. Since mirror to liquid distance is approximately 27" this angular rotation corresponds to a translation at the liquid surface of $2.875 \times 10^{-4}$ inches or equivalent 137 bits/mm or approximately 140 bits/mm.

The array area must cover the full beam (measurement of the entire beam is needed for power calibration as well as to produce the maximum information concerning the beam), and must have a number of points sufficient to resolve the desired beam profile. Typically, the spacing between points in this array is less than one tenth of the beam width. The pinhole diameter should be smaller than this resolution limit.

An "element" is the portion of a beam measured when the beam is directed at a point (m,n) of the array. Each element (m,n) has an intensity reading I(m,n). The letters m,n refer to positions or points in the X, Y directions in the array, respectively. FIG. 13 shows intensity readings in an array much as discussed here.

The beam power is measured independently and the power calibration factor k is derived from the following equation:

$$k * \sum_{m,n} I(m,n) = \text{Power (watts)} \quad [\text{Eq. 2}]$$

The power calibration factor k only applies to the selected pinhole and measuring system and laser wavelength. The independent power measurement must be made on the beam after the beam has traversed the same number of optical surfaces in the beam path. These calculations also assume that the background light signals have been eliminated and amplifier scaling compensated for.

The power/unit area at element (m,n) is given by:

Intensity (at element m,n) = $k*I(m,n)/s^2$ (watts/mm$^2$) [Eq. 3]

This is the instantaneous intensity experienced by a small area in the (m,n) element, regardless of whether the beam is stationary or moving.

When the beam is moving uniformly at the speed v (mm/sec) along the Y axis, then each element takes a time equal to s/v to pass, and the exposure energy absorbed per unit area from the element (m,n) is:

Exposure from element $(m,n) = k * I(m,n)/s^2)$. [Eq. 4]
$(s/v)$(Joules/mm$^2$)

This is the energy absorbed per unit area from a particular element (m,n) of the beam.

The total exposure (beam energy absorbed) as the entire beam passes an area equivalent in size to an element, as defined above, is:

$$\text{Exposure at } m = \left( k * \sum_n I(m,n)/s^2 \right) * (s/v)(\text{Joules/mm}^2) \quad [\text{Eq. 5}]$$

Physically speaking, this equation represents a situation in which the beam traverses in the Y direction over an area equivalent in size to an element of the beam as the term element is used above. The area is traversed by the elements of the beam corresponding to the X coordinate m, so the element-sized area at m is exposed to all elements (m,n) of the beam as n varies between O and $j_{max}$.

The calculations described above are based on discrete elements, but could obviously be generalized to use integrals. The movement is assumed along the Y axis for convenience. Other angles can be simply derived, and may be necessary if the beam is asymmetrical.

The speed v corresponds to parameters SS and SP as follows:

$v = $(SS/ScaleFactor)/(SP/100,000)(mm/sec) [Eq. 6]

Where:
SS = Step Size in bits/step;
ScaleFactor normally is 140 bits/mm;
SP/100,000 = Step Period in seconds (SP units are units equal to 10 microsec); and
1E6 = 1,000,000 is a conversion factor between Joules/mm$^2$ and Joules/m$^2$ or microJoules/mm$^2$ Equations 5 and 6 are combined to calculate the total exposure (power incident, i.e., energy) at the sensor or at the liquid (photopolymer) surface represented by Z=0 at a small area at position m as the beam is moved in the Y direction:

Exposure at $(m, z = 0)$:

$$E(m, z = 0) = \sum_n I(m,n) * \frac{k * SP * ScaleFactor * 1E6}{s * SS * 100,000} \quad [\text{Eq. 7a}]$$

$$= \frac{\sum_n I(m,n) * SP * ScaleFactor * power * 10}{\sum_{m,n} I(m,n) * SS * s} \quad [\text{Eq. 7b}]$$

Finally, the absorption of the beam as it penetrates into the liquid may now be compensated for in accordance with Beer's law:

$E(m,z) = E(m,O)*\exp(-z/\text{lambda})$ [Eq. 8]

Where:
lambda is the penetration depth (mm);
E(m,O) is the summed exposure at the surface; and
E(m,z) is the exposure at depth z below the surface (mm).

Attenuation is assumed to have no nonlinearities or time-dependence in absorption, being represented simply by $I(z) = I(z=O)*\exp(-z/\text{lambda})$. It is clear that appropriate modifications can be made to the foregoing calculations to allow for deviations from the above simple absorptive behavior.

The photopolymer has been shown experimentally to cure to a gel if the exposure is greater than a critical value Ec, so for any given system the shape of a trace of cured plastic can be predicted by calculating the locus of points having exposure Ec. Ec can be accurately and separately measured for each photopolymer. The "gel point" gives only the "cured" versus "not cured" boundary, and disregards the gradient in exposure (related to penetration depth) at resin depths other than the Ec boundary depth. Part strength seems to relate to the higher exposure, and so absorption characteristics should be chosen to give the best (highest) cure gradient. The gradient or penetration depth also limits the best available resolution in the Z direction, because some variation in exposure (crossing lines, etc.) is unavoidable and this results in cure depth changes with this variation in exposure.

For any X location (m) the cured depth $z_c(m)$ is found from:

$z_c$=lambda*ln(E(m,z=O)/Ec) [Eq. 9]

Figure 14:
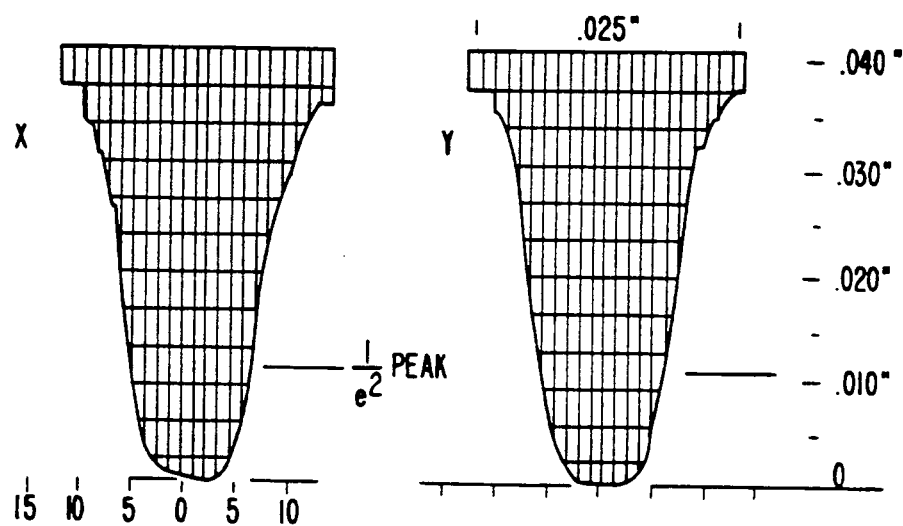
FIG. 14 shows predicted cure depth profiles along two axes generated from beam profile information from a preferred embodiment of the present invention.
Figure 15:
FIG. 15 depicts a cross-section of a cured photopolymer trace caused by exposure to a beam.

A beam profile measured with sufficient reliability and precision can be used to predict cure depths dependent only on chemical properties of a resin. FIG. 14 shows two examples of such predictions, along the X and Y axis respectively. The profile function (m,z) also permits prediction of the trace width as a function of depth (and with appropriate modifications, "beam width" and "minimum surface angle") automatically. Making and measuring "banjo tops," i.e., traces cured by the beam to directly determine the shape and dimensions of the cured photopolymer, will only be needed as an internal check of the system. FIG. 15 shows a cross-section of a test trace from a banjo top. FIG. 15 should be compared with FIG. 14.

To display the predicted trace profile, a scaled diagram of cure depth versus position is plotted across the beam. The scale factor for distance across the beam is easy, where one simply selects one column (or row, etc.) of the scan, with dimension s, to correspond to a pixel or graphics display block. The depth scale is then lambda / s pixels (or blocks) for each increase in exposure by a factor of e. The only arbitrary feature is the zero of depth, related to the characteristic exposure Ec of Eq. 9, or equivalent factors from Eq. 7. The useful depth to be displayed is determined by the dynamic range of the intensity measuring system, and truncation AT $I(m,n) \geq$ any appropriate value close to the noise level.

Software code listings of the software of a preferred embodiment of the present invention are contained in the technical appendices to the parent application, S.N. 182,830 which are herein incorporated by reference as set forth above.

It will be apparent from the foregoing that, while particular forms of the invention have been illustrated and described, various modifications can be made without departing from the spirit and scope of the invention. Accordingly, it is not intended that the invention be limited, except as by the appended claims.

What is claimed is:

1. An apparatus for determining a cure parameter in a stereolithography device for producing a three-dimensional object from a medium solidifiable to varying depths upon varying exposure to a reaction means having portions of varying intensity, said reaction means operating and moving in a prescribed pattern onto the medium comprising:
    a sensor for sensing the intensity of a portion of the reaction means when that portion of the reaction means is incident on the sensor;
    means for relatively displacing the sensor and the reaction means such that substantially all portions of the reaction means may be sensed by the sensor;
    means for determining net exposure of the medium based on the sensing of intensity by the sensor and movement of the reaction means; and
    means for calculating the cure parameter of the medium based upon the determined net exposure and known properties of the medium.

2. The apparatus of claim 1 wherein the reaction means comprises an electromagnetic beam.

3. The apparatus of claim 2 wherein the beam is a laser beam.

4. The apparatus of claim 2 wherein the medium is a fluid.

5. The apparatus of claim 4 wherein the fluid is a photopolymer.

6. The apparatus of claim 1 wherein the means for relatively displacing comprises two rotatable mirrors for displacing the reaction means.

7. The apparatus of claim 1 wherein the sensor comprises a pinhole in an opaque plate over a detector.

8. The apparatus of claim 1 wherein the cure parameter is cure depth.

9. The apparatus of claim 8 wherein the means for calculating the cure depth calculates a cure depth profile.

10. The apparatus of claim 1 wherein the cure parameter is cure width.

11. A method for calculating a cure parameter in a stereolithography apparatus for producing a three-dimensional object from a medium solidifiable to varying depths upon varying exposure to a reaction means having portions of varying intensity, said reaction means operating and moving in a prescribed pattern on the medium comprising the steps of:
    a) directing a portion of the reaction means onto a sensor and sensing the intensity of the portion of the reaction means;
    b) relatively displacing the reaction means and sensor such that a different portion of the reaction means impinges upon the sensor;
    c) repeating steps a) and b) until the intensity of substantially all portions of the reaction means have been sensed;
    d) calculating an exposure of the medium based on the sensed intensity of and movement of the reaction means; and
    e) calculating the cure parameter of the medium based upon the exposure of the medium by the reaction means and known characteristics of the medium.

12. The method of claim 11 wherein the cure parameter is cure depth.

13. The method of claim 11 wherein the cure parameter is cure width.

14. A method for determining a cure depth of an area element of a medium in a stereolithography device for producing a three-dimensional object on substantially a layer by layer basis, wherein the medium is solidifiable to a depth which is determined by exposure of the medium to a reaction means operating in a prescribed pattern at a working surface of the medium comprising the steps of:
    sensing an intensity of a portion of the reaction means when that portion of the reaction means is incident on a sensor;
    relatively displacing the sensor and the reaction means such that substantially all portions of the reaction means may be sensed by the sensor;
    calculating net exposure in the area element of the medium at approximately the working surface by summing the intensity of each portion of the reaction means that is passed over the area element, wherein the intensity of each portion is multiplied by a time over which each portion of the reaction means is incident on the area element; and
    calculating the cure depth of the area element of the medium provided by the exposure from the reaction means and known curing properties of the medium.

15. A method for determining a scanning speed necessary to achieve a desired cure parameter in a stereolithography device for producing a three-dimensional object from a medium solidifiable to varying depths upon varying exposure to a reaction means operating in a prescribed pattern onto a surface of the medium, comprising the steps of:
    determining a required exposure to obtain the desired cure parameter in an area element of the medium, based on characteristics of the medium;
    generating a profile of an intensity of the reaction means;
    specifying a scanning direction and path of the reaction means as it crosses the area element of the medium;
    calculating an integrated intensity profile of the reaction means in a direction parallel to the scanning direction by utilizing the profile of the intensity of the reaction means and the known scanning direction; and
    calculating the scanning speed at which the reaction means must move across the area element, such that the integrated intensity profile of the reaction means appropriately exposes the area element, by utilizing the integrated intensity profile of the reaction means, the path of the reaction means, and the required exposure.

16. The method of claim 15 wherein the cure parameter is the cure depth.

17. The method of claim 16 wherein the medium is a substance having a critical exposure and having an absorption characteristic which substantially follows Beer's law wherein the absorption characteristic is penetration depth.

18. The method of claim 15 wherein the cure parameter is cure width.

19. An apparatus for determining an intensity profile of a reaction means in a stereolithography system for producing a three-dimensional object substantially on a layer by layer basis at a surface of a building medium, comprising:
- a sensor for sensing the intensity of part of the reaction means when that part of the reaction means is incident on the sensor; and
- a single directing means for directing each part of the reaction means onto the sensor to determine the intensity of each part of the reaction means, thereby determining the intensity profile for the reaction means and for directing the reaction means onto the surface of the medium for producing the object.

20. An apparatus for determining a scanning speed necessary to achieve a desired cure parameter in a stereolithography device for producing a three-dimensional object from a medium solidifiable to varying depths upon varying exposure to a reaction means operating in a prescribed pattern onto a surface of the medium comprising:
- means for determining a required exposure to obtain the desired cure parameter in a area element of the medium, based on curing characteristics of the medium;
- means for generating a profile of an intensity of the reaction means;
- means for specifying a scanning path and direction of the reaction means as it crosses the area element of the medium;
- means for calculating an integrated intensity profile of the reaction means in a direction parallel to the scanning direction by utilizing the profile of the intensity of the reaction means and the scanning direction; and
- means for calculating the scanning speed at which the reaction means must move across the area element, such that the integrated intensity profile of the reaction means appropriately exposes the area element, by utilizing the integrated intensity profile of the reaction means, the scanning path and the required exposure.

21. The apparatus of claim 20 wherein the cure parameter is cure depth.

22. The apparatus of claim 20 wherein the cure parameter is cure width.

* * * * *